United States Patent
Tong et al.

(10) Patent No.: US 8,802,492 B2
(45) Date of Patent: Aug. 12, 2014

(54) METHOD FOR FORMING RESISTIVE SWITCHING MEMORY ELEMENTS

(75) Inventors: Jinhong Tong, Santa Clara, CA (US); Randall Higuchi, San Jose, CA (US); Imran Hashim, Saratoga, CA (US); Vidyut Gopal, Sunnyvale, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 212 days.

(21) Appl. No.: 13/219,806

(22) Filed: Aug. 29, 2011

(65) Prior Publication Data

US 2013/0048937 A1    Feb. 28, 2013

(51) Int. Cl.
*H01L 21/00* (2006.01)
*H01L 21/16* (2006.01)

(52) U.S. Cl.
USPC ...... 438/104; 438/763; 438/785; 257/E21.68; 257/E21.2

(58) Field of Classification Search
CPC .............. H01L 21/02172; H01L 21/02175; H01L 21/02178; H01L 21/02181; H01L 21/02186; H01L 21/02189; H01L 21/02192; H01L 21/02194; C23C 16/45525
USPC ......... 438/104, 763, 785; 257/E21.68, E21.2, 257/E21.247; 118/715
See application file for complete search history.

(56) References Cited

U.S. PATENT DOCUMENTS

| | | | |
|---|---|---|---|
| 7,084,078 B2 | 8/2006 | Ahn et al. | |
| 7,629,198 B2 * | 12/2009 | Kumar et al. | 438/104 |
| 8,008,096 B2 * | 8/2011 | Fuchigami et al. | 438/3 |
| 8,144,498 B2 * | 3/2012 | Kumar et al. | 365/148 |
| 8,343,813 B2 * | 1/2013 | Kuse et al. | 438/133 |
| 8,420,478 B2 | 4/2013 | Chiang et al. | |
| 2006/0076549 A1 | 4/2006 | Ufert | |
| 2011/0227024 A1 | 9/2011 | Sekar | |
| 2011/0233509 A1 | 9/2011 | Shigeoka | |
| 2012/0052681 A1 * | 3/2012 | Marsh | 438/680 |

OTHER PUBLICATIONS

Kuo et. al.; Characterization of nonstoichiometric TiO2 and ZrO2 thin films stabilized by Al2O3 and SiO2 additions; Jan. 1, 2003; Academia—National Dong Hwa University, Taiwan; J. Vac. Sci. Technol. A 21?6? Nov. Dec. 2003.

Kim et al.; Anodeinterlace localized filamentary mechanism in resistive switching of TiO2 thin films; Jul. 6, 2007; American Institute of Physics; Applied Physics Letters Jul. 6, 2007 pp. 01290710129073 vol. 91.

Smyth; The defect chemistry or metal oxides; Jan. 1, 2000; Z—Book—Author; Chapters 15 8 9 and 12 pp. 174 118161 and 217237.

Toriumi et al; Doped HfO2 for Higherk Dielectrics; Jan. 1, 2005; University of Tokyo; 208th ECS Meeting Abstract #508.

Xiang, W., et al.; Heteroepitaxial Growth of NbDoped SrTiO3 Films on Si Substrates by Pulsed Deposition for Resistance Memory Applications; Jan. 1, 2007; Academia—Gwangju Institute of Science and Technology (Gwangju, KR) ; Applied Physics Letters vol. 90 pp. 0521101 to 0521103.

(Continued)

*Primary Examiner* — Leonard Chang (57) ABSTRACT

Methods for producing RRAM resistive switching elements having reduced forming voltage include doping to create oxygen deficiencies in the dielectric film. Oxygen deficiencies in a dielectric film promote formation of conductive pathways.

19 Claims, 9 Drawing Sheets

(56) References Cited

OTHER PUBLICATIONS

Kim, W.., et al.; FormingFree NitrogenDoped AlOx RRAM with SubuA Programming Current; Jan. 1, 2011; Academia—Stanford University; Symposium on VLSI Technology Digest of Technical Papers pp. 2223.

Tai., Y., et al.; Thermal Conductivity of Heavily Doped LowPressure Chemical Vapor Deposited Polycrystalline Silicon Films; Mar. 1, 1988; American Institute of Physics; J. Appl. Phys. pp. 14421449.

Lee, D., et al.; Resistance Switching of Copper Doped MoOx Films for Nonvolatile Memory Applications; Mar. 20, 2007; Applied Physics Letters 3 pages.

* cited by examiner

METHOD FOR FORMING RESISTIVE SWITCHING MEMORY ELEMENTS

FIELD OF THE INVENTION

The present invention relates generally to semiconductor memories and more particularly a method for forming a resistive switching memory element with reduced forming and switching voltages.

BACKGROUND OF THE INVENTION

All but the simplest of electronic devices utilize nonvolatile memories. When an electronic device must retain information during and after being placed in an unpowered state, nonvolatile memories must be provided. Several types of nonvolatile memories are known in the art. Nonvolatile memories may be portable, auxiliary, or integrated in a circuit or as a component in both general and embedded computer systems. Most generally, nonvolatile memories are found in digital cameras, cellular telephones, music players, and as the key component in portable memory devices such as USB based flash drives.

Nonvolatile memory is often formed using electrically-erasable programmable read only memory (EPROM) technology. EPROM, also known as flash memory, uses an architecture that is inadequate in its access, erase and write times for the rapidly increasing operational speed requirements and rapidly decreasing size requirements of electronic devices. What is needed is memory architecture with faster access, erase and write times scalable to smaller devices. Volatile memories (such as Random Access Memory (RAM)) can potentially be replaced by nonvolatile memories if the speeds of nonvolatile memories are increased to meet the requirements for RAM and other applications currently using volatile memories. Resistive switching memories may provide an alternative to flash memories.

Resistive switching nonvolatile memories are formed of arrays of resistive switching elements where each element has two or more stable resistive states. Bi-stable resistive switching elements have two stable states. The application of an electric field having a particular voltage or current will result in a desired element resistance. Voltage pulses are typically used to switch the memory element from one resistance state to the other.

Resistive switching elements use a "forming process" to prepare a memory device for use. The forming process is typically applied at the factory, at assembly, or at initial system configuration. A resistive switching material is normally insulating, but a sufficient voltage (known as a forming voltage) applied to the resistive switching material will form one or more conductive pathways in the resistive switching material. Through the appropriate application of various voltages (e.g. a set voltage and reset voltage), the conductive pathways may be modified to form a high resistance state or a low resistance state. For example, a resistive switching material may change from a first resistivity to a second resistivity upon the application of a set voltage, and from the second resistivity back to the first resistivity upon the application of a reset voltage.

Resistive switching memory uses peripheral transistors to control the application of voltage to the resistive switching material, and thereby alter the resistive state of the resistive switching material. Resistive switching memory with a high forming voltage requires high voltage peripheral transistors. High voltage peripheral transistors add to the cost and complexity of the resistive switching memory. Consequently, a resistive switching memory with reduced forming voltage is desired.

One method for reducing forming voltage in resistive switching memory includes doping resistive switching elements with a dopant to increase the propensity of the resistive switching elements to form conductive pathways by creating electronic defects in the resistive switching element. One doping scheme includes depositing a dielectric host metal precursor during one cycle of an atomic layer deposition process, oxidizing the dielectric host metal precursor, and then depositing a dopant during a subsequent cycle of the atomic layer deposition process. This methodology results in a resistive switching element with doped and undoped layers of host metal oxide or nano-laminates. The nano-laminates do not provide adequate electronic defect density for ideal electron transport through the metal oxide/insulator. What is needed is a method for embedding dopant throughout the metal oxide or in an area of the metal oxide near one or more of the electrodes to improve defect density and improve switching behavior of the host metal oxide.

BRIEF DESCRIPTION OF THE DRAWINGS

The numerous objects and advantages of the present invention may be better understood by those skilled in the art by reference to the accompanying figures in which.

DETAILED DESCRIPTION

The present invention relates to methods for producing Resistive Random Access Memory (RRAM) resistive switching elements having a reduced forming and switching voltages. Embodiments of the present invention may reduce forming and set voltages by doping the insulator with a dopant that enhances the insulator's ability to form conductive pathways. The dopant may be uniformly distributed throughout the insulator or the dopant may be uniformly distributed in a region near the interface between the insulator and an electrode.

RRAM resistive switching elements with reduced forming and set voltages are useful because RRAM resistive switching elements with reduced forming and set voltages require lower voltage peripheral transistors. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

RRAM Cell Formation

A RRAM cell may include two electrodes with a resistive switching element, generally comprised of a dielectric metal oxide, placed between the two electrodes. In RRAM, forming is a process by which the resistive switching element in the RRAM cell is put into its low resistance state for the first time. The process is performed by applying a voltage, called the forming voltage, across two electrodes of a resistive switching element to form one or more conductive pathways in the resistive switching element. Conductive pathways formed during the forming process reduce the resistance of the resistive switching element. Once the forming process is complete, a certain voltage, called the reset voltage, applied across the two electrodes will reset the conductive pathways, thereby increasing the resistance of the resistive switching element. Another voltage, called the set voltage, applied across the two electrodes will reform the conductive pathways, thereby reducing the resistance of the resistive switching element. The set voltage and reset voltage are typically lower than the forming voltage.

A RRAM cell may be regarded as storing a logical bit; where the resistive switching element has increased resistance, the RRAM cell may be regarded as storing a "0" bit; where the resistive switching element has reduced resistance, the RRAM cell may be regarded as storing a "1" bit. Other circuitry associated with the RRAM cell, known in the art, reads the resistive state of the resistive switching element by applying a read voltage to the two electrodes and measuring the corresponding current through the resistive switching element. Where the current through the resistive switching element is greater than some predetermined baseline current, the resistive switching element must be in a reduced resistance state, and therefore the RRAM cell is storing a logical "1;" where the current through the resistive switching element is less than some predetermined baseline current, the resistive switching element must be in an increased resistance state, and therefore the RRAM cell is storing a logical "0." The read voltage is typically some predetermined voltage, less than the set voltage, the reset voltage and the forming voltage. The read voltage must be sufficient to determine the resistive state of the resistive switching element, but must not alter the conductive pathways of the resistive switching element.

Forming voltage, set voltage, reset voltage and read voltage, and the increased resistive state and reduced resistive state, are all functions of the electrodes used in the resistive switching element, the type of resistive switching material used in the resistive switching element, and the processes performed on those electrodes and resistive switching material such as doping and annealing. Manufacturers desire RRAM with discrete, well defined increased and reduced resistive states, and reduced forming voltage.

Figure 1:
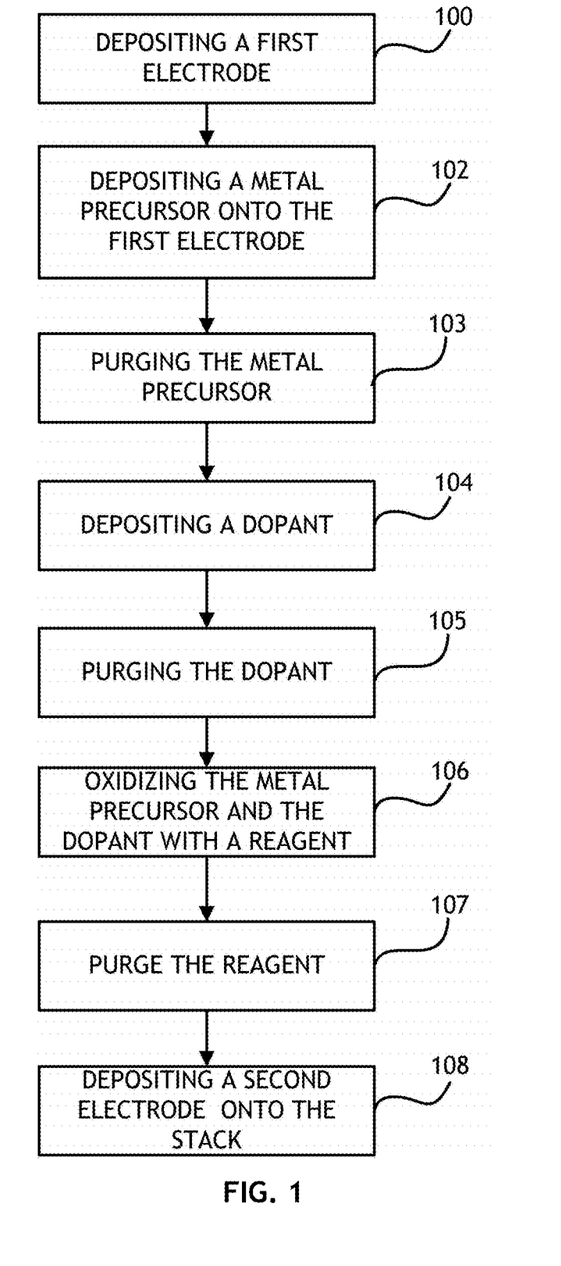
FIG. 1 shows a flowchart depicting one method for forming a resistive switching memory element with reduced forming and switching voltages.
Figure 2:
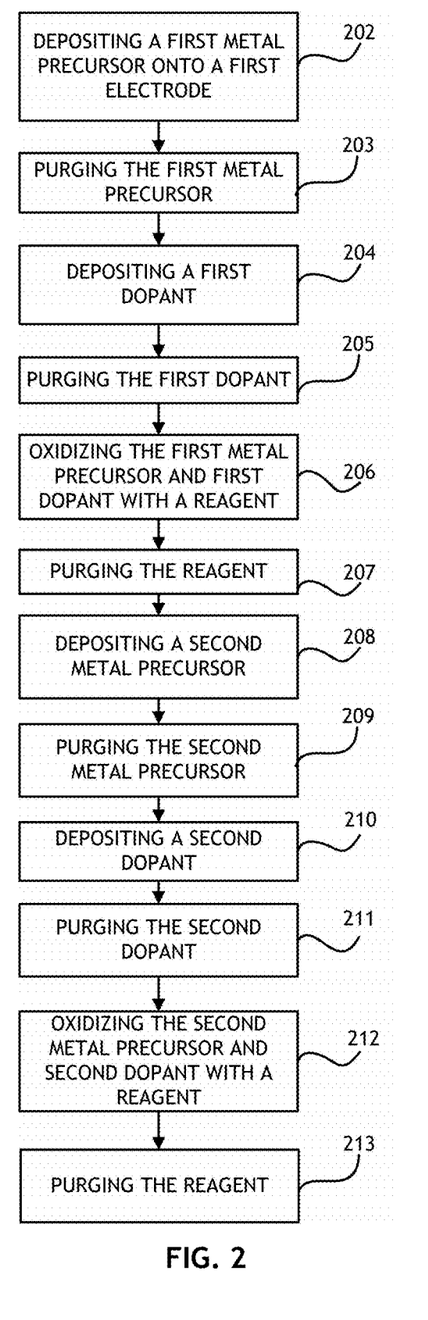
FIG. 2 shows a flowchart depicting another method for forming a resistive switching memory element with reduced forming and switching voltages.

Reducing Forming Voltage by Doping a Dielectric Material as in FIG. 1 and FIG. 2

Referring to FIG. 1, a method for forming a resistive switching element by an atomic layer deposition (ALD) process is shown. A first electrode may be deposited 100 onto a substrate. The first electrode is a material suitable for use in a resistive switching element, such as polycrystalline silicon (poly-Si), P+poly, Titanium Nitride (TiN) or Tungsten (W). A metal oxide film may then be deposited 102 onto the first electrode by ALD, chemical vapor deposition (CVD), physical vapor deposition (PVD) or some equivalent process. For the ALD process, a metal precursor may be used to form a dielectric suitable for use in a resistive switching element such as hafnium oxide ($HfO_X$), Zirconium Oxide ($ZrO_X$) or Titanium Oxide ($TiO_X$). Any excess metal precursor may then be purged 103 from the processing chamber by an inert gas such as argon (Ar). Purging in ALD processing is commonly understood to refer to the removal of excess gas from the processing chamber, while leaving a layer or quantity of precursor, reagent or dopant deposited on the substrate. A dopant may then be deposited 104 onto the metal precursor by ALD, CVD or PVD. The dopant may be configured to increase oxygen vacancies in the resulting metal oxide. Oxygen vacancies are a specific type of anomaly in the structure of a dielectric material that enhances the ability of the dielectric material to form conductive pathways. The dopant, for the case of the Hf, Zr, and Ti precursors, may be a material such as copper ($Cu^{2+}$), strontium ($Sr^{2+}$), aluminum ($Al^{3+}$), yttrium ($Y^{3+}$), lanthanum ($La^{3+}$), zirconium ($Zr^{4+}$) or titanium ($Ti^{4+}$). Aliovalent dopants such as $Cu^{2+}$, $Sr^{2+}$, $Al^{3+}$, $Y^{3+}$, $La^{3+}$ are preferred for the tetravalent precursors because these will create vacancies in a compound such as hafnium oxide when these dopants replace a tetravalent atom such as $Hf^{4+}$. In this embodiment, depositing the metal precursor, purging the metal precursor and depositing the dopant occur sequentially without any intervening oxidations. By depositing the dopant before oxidizing the precursor, the precursor may substantially uniformly absorb the dopant to form a homogeneously doped region. Any unabsorbed dopant may then be purged 105 from the processing chamber by an inert gas such as Ar. The metal precursor and dopant may then be oxidized 106 with a reagent. By oxidizing only after the metal precursor has been doped by a dopant, oxygen vacancies are created in the resulting metal oxide. Any unreacted reagent may then be purged 107 from the processing chamber by an inert gas such as Ar. A second electrode may then be deposited 108 onto the stack. The second electrode is a material suitable for use in a resistive switching element such as titanium nitride or TiN. Processes other then ALD are not shown in FIG. 1 but may be used to implement the present invention.

Referring to FIG. 2, a resistive switching element may undergo multiple depositions, dopings and oxidations in an ALD process to achieve a desired thickness. In this embodiment, a first electrode comprising a suitable material such as poly-Si, P+poly, TiN or W may be deposited onto a substrate. A metal oxide film may then be deposited 202 onto the first electrode by ALD, CVD, PVD or some equivalent process. For the ALD process, a metal precursor may be used to form a dielectric suitable for use as an insulator in a resistive switching element such as $HfO_X$, $ZrO_X$ or $TiO_X$. Any excess metal precursor may then be purged 203 from the processing chamber by an inert gas such as Ar. A dopant may then be deposited 204 onto the metal precursor by ALD, CVD or PVD. The dopant may be configured to increase oxygen vacancies in resulting metal oxide. The dopant, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$. Aliovalent dopants such as $Cu^{2+}$, $Sr^{2+}$, $Al^{3+}$, $Y^{3+}$, $La^{3+}$ are preferred for the tetravalent precursors because these will create vacancies in a compound such as hafnium oxide when these dopants replace a tetravalent atom such as $Hf^{4+}$. Any unabsorbed dopant may then be purged 205 from the processing chamber by an inert gas such as Ar. The metal precursor and dopant may then be oxidized 206 with a reagent. By oxidizing only after the metal precursor has been doped by a dopant, oxygen vacancies are created in the resulting metal oxide. Any unreacted reagent may then be purged 207 from the processing chamber by an inert gas such as Ar. Then a second metal precursor may be deposited 208 by ALD, CVD, PVD or some equivalent process. The second metal precursor may be similar in composition to the first metal precursor, composed of a dielectric forming metal such as Hf. Deposition pressure or concentration or both may be varied relative to the deposition of the first metal precursor to achieve a resulting metal oxide with desirable electronic properties such as low forming voltage. Any excess metal precursor may then be purged 209 from the processing chamber by an inert gas such as Ar. A second dopant may then be deposited 210 onto the second metal precursor by ALD, CVD or PVD. The dopant may be configured to increase oxygen vacancies in the resulting metal oxide. The dopant, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$. Deposition pressure or concentration or both may be varied relative to the deposition of the first dopant to achieve a resulting metal oxide with desirable electronic properties such as low forming voltage. Any unabsorbed dopant may then be purged 211 from the processing chamber by an inert gas such as Ar. The second metal precursor and dopant may then be oxidized 212 by a reagent. By oxidizing only after the second metal precursor has been doped by a dopant, oxygen vacancies are created in the resulting metal oxide. Any unreacted reagent may then be purged 213 from the processing chamber by an inert gas such as Ar. After an appropriate number of deposition cycles, a second electrode may then be deposited onto the stack. The second electrode may be a material suitable for use in a resistive switching element such as TiN, Poly-Si, W or Tantalum Nitride (TaN). By this method, a resistive switching element is produced with an insulator having layers of substantially uniformly doped dielectric. Uniform doping of the dielectric may enhance the ability of the dielectric to form multiple conductive pathways, and thereby lower the forming and set voltages of the resistive switching element. Processes other then ALD are not shown in FIG. 2 but may be used to implement the present invention.

Figure 3:
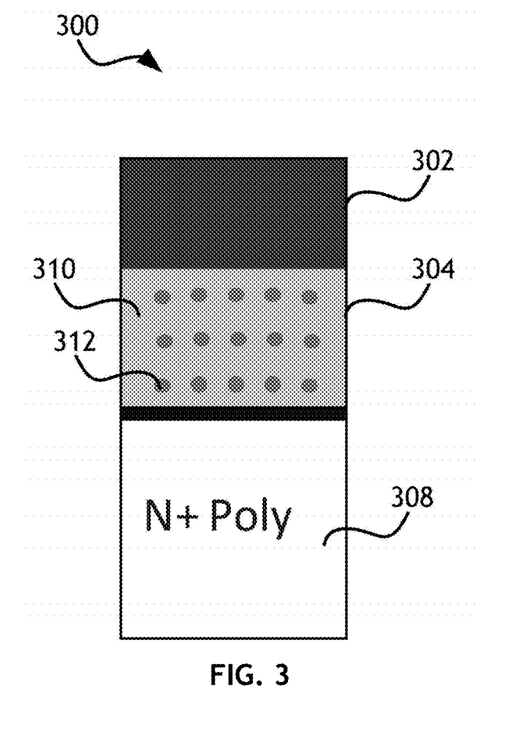
FIG. 3 shows a block diagram of a resistive switching element produced by embodiments such as those depicted in FIG. 1 and FIG. 2.

Referring to FIG. 3, a resistive switching element produced by this embodiment may include a first electrode of poly-Si 308, covered by a resistive switching element 304. The resistive switching element 304 is composed of a $HfO_X$ host oxide 310 embedded with an Al or Ti dopant 312. Finally, a second electrode 302 covers the resistive switching element 304. The second electrode may be a material such as TiN, Poly-Si, W or TaN.

Figure 4:
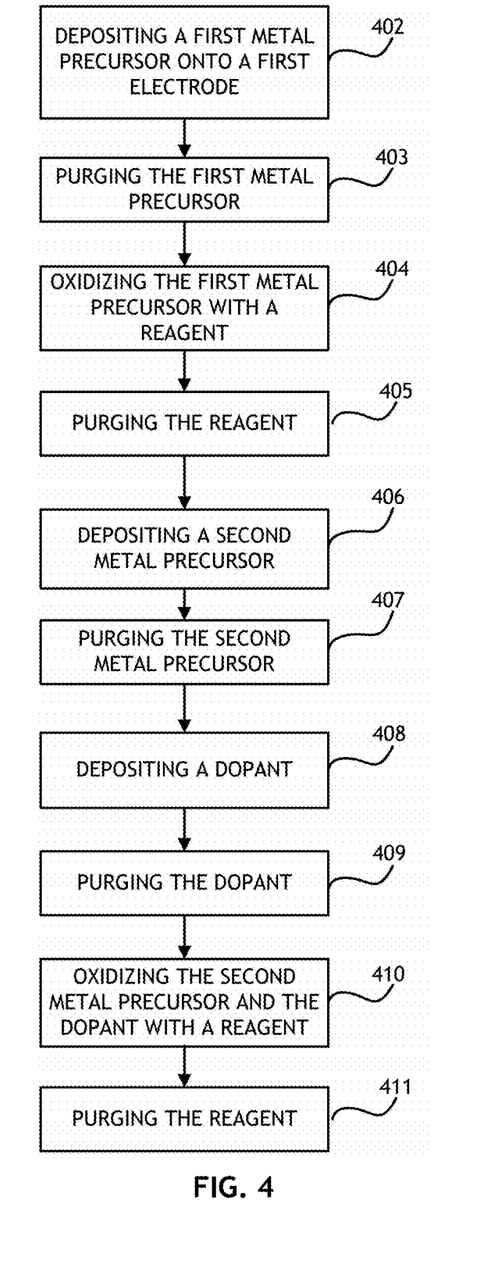
FIG. 4 shows a flowchart depicting another method for forming a resistive switching memory element with reduced forming and switching voltages.
Figure 6:
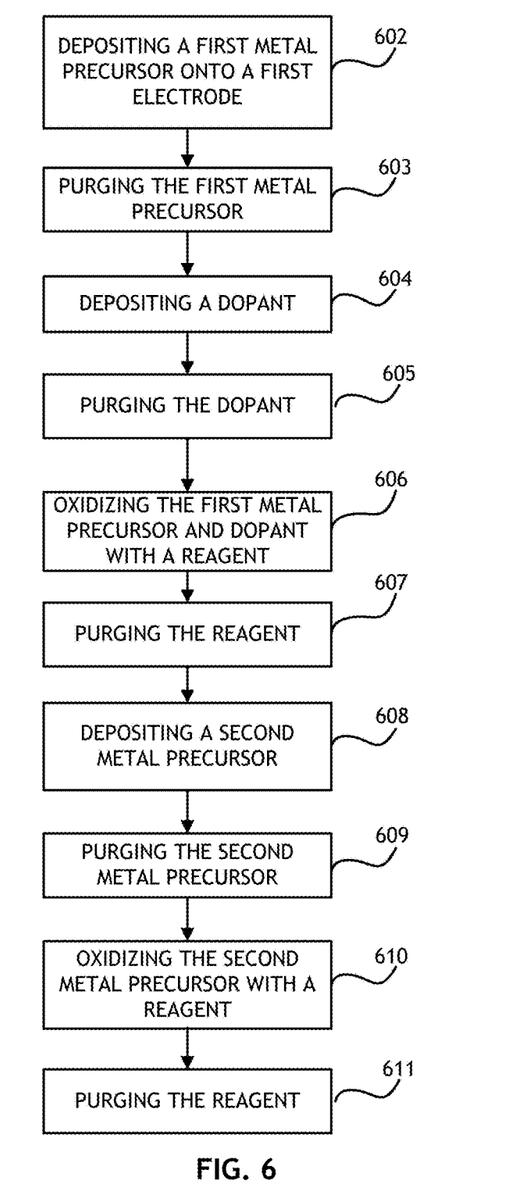
FIG. 6 shows a flowchart depicting another method for forming a resistive switching memory element with reduced forming and switching voltages.

Concentrating Dopant Near an Electrode as in FIG. 4 and FIG. 6

Referring to FIG. 4, an alternative method is shown for forming a resistive switching element by an ALD process with a doped region concentrated near the second electrode. In this embodiment, a first electrode comprising a suitable material such as poly-Si, P+poly, TiN or W may be deposited onto a substrate. A metal oxide film may then be deposited 402 onto the first electrode by ALD, CVD, PVD or some equivalent process. For the ALD process, a metal precursor may be used to form a dielectric suitable for use as an insulator in a resistive switching element such as $HfO_X$, $ZrO_X$ or $TiO_X$. Any excess metal precursor may then be purged 403 from the processing chamber by an inert gas such as Ar. The deposited metal precursor may then be oxidized 404 with a reagent. Any unreacted reagent may then be purged 405 from the processing chamber by an inert gas such as Ar. Then a second metal precursor may be deposited 406 by ALD, CVD, PVD or some equivalent process. The second metal precursor may be similar in composition to the first metal precursor, composed of a dielectric forming metal such as Hf. Deposition pressure or concentration or both may be varied relative to the deposition of the first metal precursor to achieve a resulting metal oxide with desirable electronic properties such as low forming voltage. Any excess metal precursor may then be purged 407 from the processing chamber by an inert gas such as Ar. A dopant may then be deposited 408 onto the second metal precursor by ALD, CVD or PVD. The dopant may be configured to increase oxygen vacancies in the resulting metal oxide. The dopant, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$. Aliovalent dopants such as $Cu^{2+}$, $Sr^{2+}$, $Al^{3+}$, $Y^{3+}$, $La^{3+}$ are preferred for the tetravalent precursors because these will create vacancies in a compound such as hafnium oxide when these dopants replace a tetravalent atom such as $Hf^{4+}$. Any unabsorbed dopant may then be purged 409 from the processing chamber by an inert gas such as Ar. The second metal precursor and dopant may then be oxidized 410 by a reagent. By oxidizing only after the second metal precursor has been doped by a dopant, oxygen vacancies are created in the resulting metal oxide. Any unreacted reagent may then be purged 411 from the processing chamber by an inert gas such as Ar. Metal precursor may continue to be deposited, doped and oxidized until the resistive switching element reaches an appropriate thickness, then a second electrode may be deposited onto the stack. The second electrode may be a material suitable for use in a resistive switching element such as TiN, Poly-Si, W or TaN. By this method, a resistive switching element is produced with an insulator having layers of substantially uniformly doped dielectric. Uniform doping of the dielectric may enhance the ability of the dielectric to form multiple conductive pathways, and thereby lower the forming and set voltages of the resistive switching element. Processes other then ALD are not shown in FIG. 4 but may be used to implement the present invention.

Figure 5:
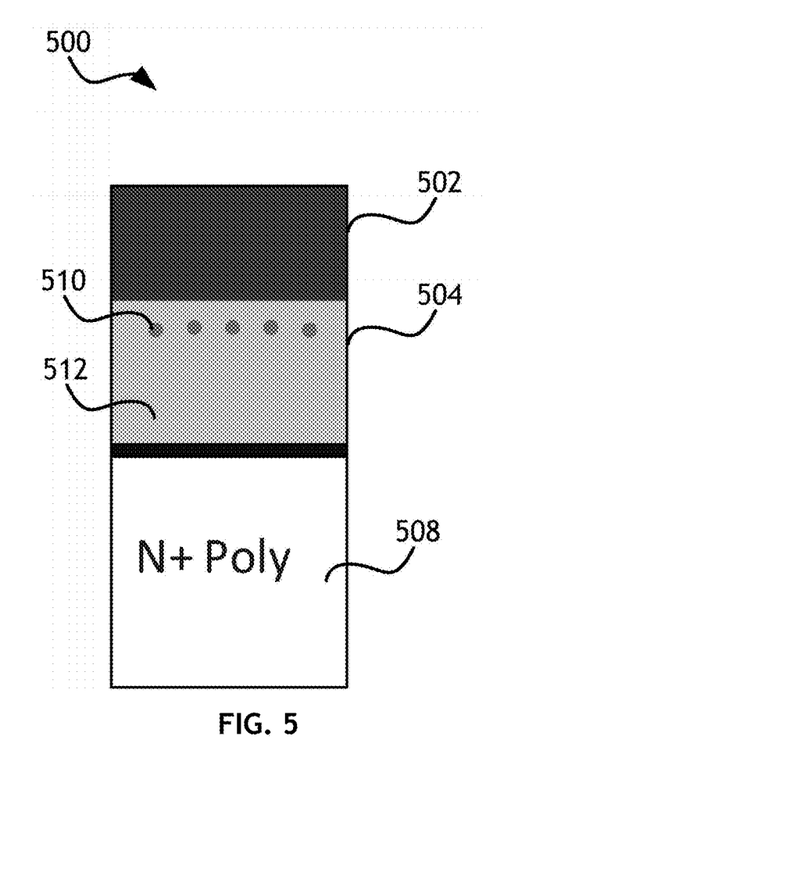
FIG. 5 shows a block diagram of a resistive switching element produced by embodiments such as that depicted in FIG. 4.

Referring to FIG. 5, a resistive switching element 500 produced by this method is shown. The resistive switching memory has a first electrode of poly-Si 508, covered by a resistive switching element 504 composed of a HfOx, $ZrO_X$ or $TiO_X$ host oxide 512 embedded with an Cu, Sr, Al, Y, La, Zr or Ti dopant 510. Finally, a TiN electrode 502 covers the resistive switching element 504. The dopant 510 is concentrated in a region of the resistive switching element 504 near the TiN electrode 502.

Alternatively, referring to FIG. 6, a method is shown for forming a resistive switching element by an ALD process with a doped region near the first electrode. In this embodiment, a first electrode comprising a suitable material such as poly-Si, P+poly, TiN or W may be deposited onto a substrate. A metal oxide film may then be deposited 602 onto the first electrode by ALD, CVD, PVD or some equivalent process. For the ALD process a metal precursor may be used to form form a dielectric suitable for use as an insulator in a resistive switching element such as $HfO_X$, $ZrO_X$ or $TiO_X$. Any excess metal precursor may then be purged 603 from the processing chamber by an inert gas such as Ar. A dopant may be deposited 604 onto the first metal precursor by ALD, CVD or PVD. The dopant may be configured to increase oxygen vacancies in the resulting metal oxide. The dopant, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$. Aliovalent dopants such as $Cu^{2+}$, $Sr^{2+}$, $Al^{3+}$, $Y^{3+}$, $La^{3+}$ are preferred for the tetravalent precursors because these will create vacancies in a compound such as hafnium oxide when these dopants replace a tetravalent atom such as $Hf^{4+}$. Any unabsorbed dopant may then be purged 605 from the processing chamber by an inert gas such as Ar. The deposited metal precursor and dopant may then be oxidized 606 with a reagent. By oxidizing only after the first metal precursor has been doped by a dopant, oxygen vacancies are created in the resulting metal oxide. Any unreacted reagent may then be purged 607 from the processing chamber by an inert gas such as Ar. Then a second metal precursor may be deposited 608 by ALD, CVD, PVD or some equivalent process. The second metal precursor may be similar in composition to the first metal precursor, composed of a dielectric forming metal such as Hf, Zr or Ti. Deposition pressure or concentration or both may be varied relative to the deposition of the first metal precursor to achieve a resulting metal oxide with desirable electronic properties such as low forming voltage. Any excess metal precursor may then be purged 609 from the processing chamber by an inert gas such as Ar. The second metal precursor may then be oxidized 610 by a reagent. Any unreacted reagent may then be purged 611 from the processing chamber by an inert gas such as Ar. Metal precursor may continue to be deposited and oxidized until the resistive switching element reaches an appropriate thickness, then a second electrode may be deposited onto the stack. The second electrode may be a material suitable for use in a resistive switching element such as TiN, Poly-Si, W or TaN. By this method, a resistive switching element is produced with an insulator having layers of substantially uniformly doped dielectric. Uniform doping of the dielectric may enhance the ability of the dielectric to form multiple conductive pathways, and thereby lower the forming and set voltages of the resistive switching element. Processes other then ALD are not shown in FIG. 6 but may be used to implement the present invention.

A resistive switching element with dopant concentrated in a region of the resistive switching layer near the first or second electrode may impact defect position and concentration. Doping can modulate host oxide crystallinity and make the stack film more resistive upon thermal treatment, thus reducing forming voltage and switching current. The dopant concentrated in the region of the resistive switching layer near the second electrode may also provide strong oxygen guttering and create more oxygen vacancy to reduce forming voltage.

Figure 7:
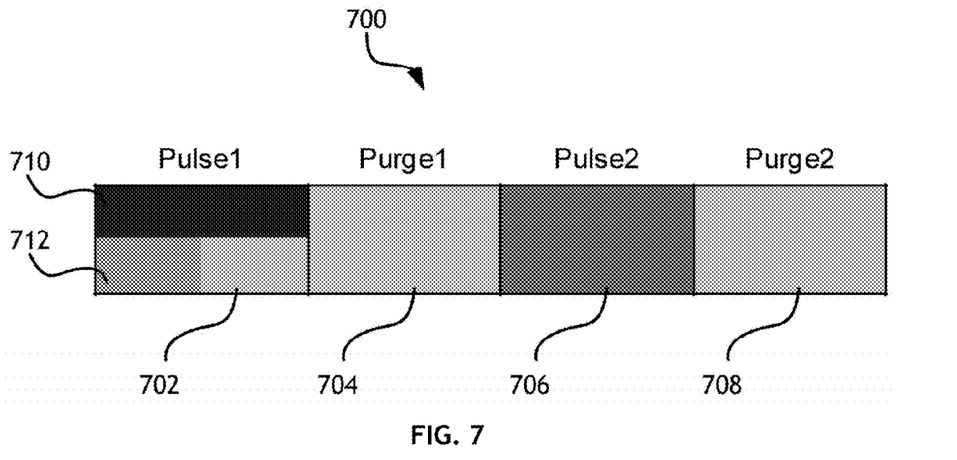
FIG. 7 shows a diagram of an ALD cycle where a host metal precursor and dopant are deposited contemporaneously.
Figure 8:
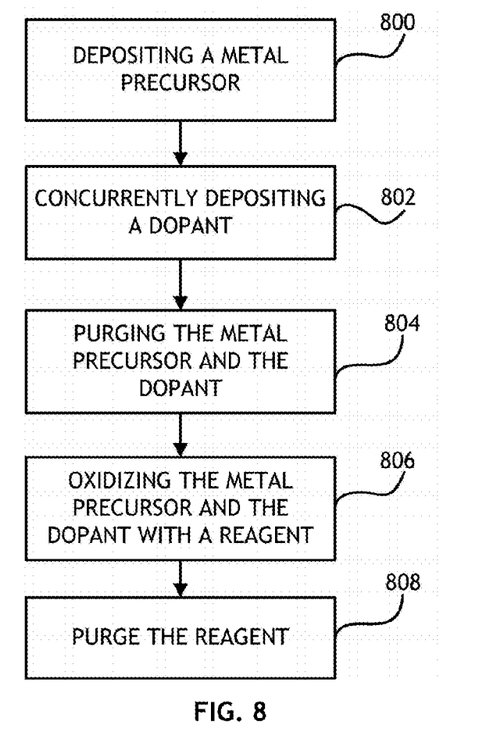
FIG. 8 shows a diagram of an ALD process where a host metal precursor and dopant are deposited in alternating order during alternating ALD cycles.

Contemporaneous Metal Precursor Deposition and Doping as in FIG. 7 and FIG. 8

Referring to FIG. 7, a diagram of an ALD deposition cycle 700 is shown. ALD generally comprises multiple cycles 700 of depositions; each cycle 700 comprises depositing 702 a precursor, purging 704 the precursor, depositing 706 a reagent, and purging 708 the reagent. In some embodiments of the present invention, depositing the precursor 702 may comprise at least partially contemporaneously depositing a metal precursor 710 and a dopant 712. The metal precursor 710 may comprise a material suitable for forming a dielectric insulator in a resistive switching element such as Hf, Zr or Ti. The dopant 712, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$, configured to increase oxygen vacancies in the resulting metal oxide. Contemporaneous deposition of the metal precursor 710 and dopant 712 ensures that the dopant is substantially uniformly embedded in the metal precursor 710.

Referring to FIG. 8, a method is shown for forming a resistive switching element by an ALD process by simultaneously depositing a metal precursor and dopant. In this embodiment, a first electrode comprising a suitable material such as poly-Si, P+poly, TiN or W may be deposited onto a substrate. A metal oxide film may then be deposited 800 onto the first electrode by ALD, CVD, PVD or some equivalent process. For the ALD process a metal precursor may be used to form a dielectric suitable for use as an insulator in a resistive switching element such as $HfO_X$, $ZrO_X$ or $TiO_X$. A dopant may be deposited 802 simultaneously with the metal precursor by the same process. The dopant may be configured to increase oxygen vacancies in resulting metal oxide. The dopant, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$. Aliovalent dopants such as $Cu^{2+}$, $Sr^{2+}$, $Al^{3+}$, $Y^{3+}$, $La^{3+}$ are preferred for the tetravalent precursors because these will create vacancies in a compound such as hafnium oxide when these dopants replace a tetravalent atom such as $Hf^{4+}$. Any excess metal precursor and unabsorbed dopant may then be purged 804 from the processing chamber by an inert gas such as Ar. The metal precursor and dopant may then be oxidized 806 with a reagent. Because the metal precursor and dopant where deposited simultaneously, the metal precursor is substantially uniformly doped. Any unreacted reagent may then be purged 808 from the processing chamber by an inert gas such as Ar. Similar deposition, doping and oxidizing cycle may continue until the resistive switching element achieves the desired thickness. At each successive deposition cycle, deposition and doping pressure or concentration or both may be varied relative to the preceding cycle to achieve a resulting metal oxide with desirable electronic properties such as low forming voltage. After an appropriate number of deposition cycles, a second electrode may then be deposited onto the stack. The second electrode may be a material suitable for use in a resistive switching element such as TiN, Poly-Si, W or TaN. By this method, a resistive switching element is produced with an insulator having layers of substantially uniformly doped dielectric. Uniform doping of the dielectric may enhance the ability of the dielectric to form multiple conductive pathways, and thereby lower the forming and set voltages of the resistive switching element. Processes other then ALD are not shown in FIG. 8 but may be used to implement the present invention.

Figure 9:
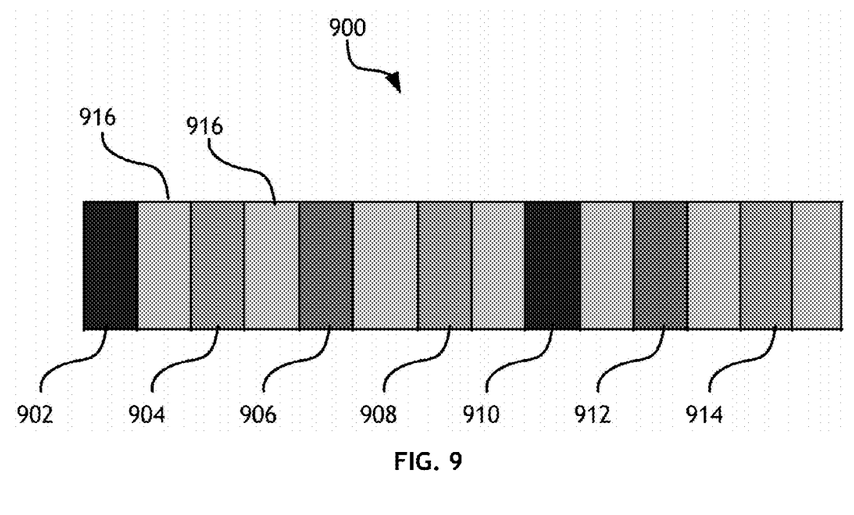
Figure 10:
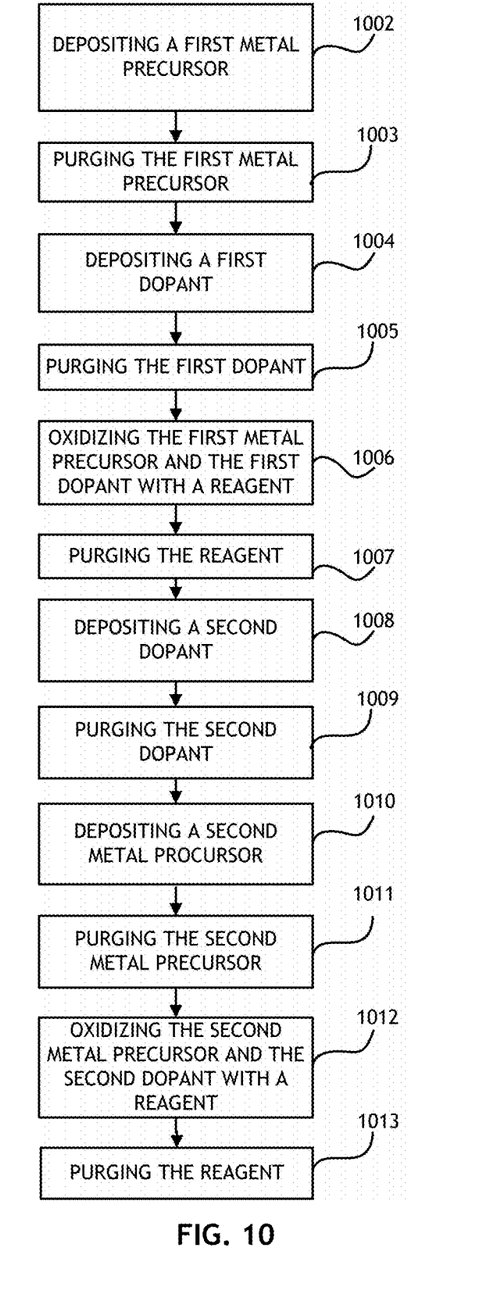

Alternating Metal Precursor Deposition and Doping as in FIG. 9 and FIG. 10

Referring to FIG. 9, a diagram of an ALD deposition cycle 900 is shown. In some embodiments of the present invention, the ALD deposition cycle comprises depositing 902 a metal precursor, purging 916 the metal precursor, depositing 904 a dopant, purging 916 the dopant, depositing 906 a reagent to oxidize the metal precursor and dopant, and purging 916 the reagent. A new cycle may then begin by depositing 908 a dopant, purging 916 the dopant, and then depositing 910 a metal precursor, purging 916 the metal precursor, depositing 912 a reagent, purging 916 the reagent and depositing 914 a dopant. Alternating the order of deposition between metal precursor and dopant allows a manufacturer to control the concentration of dopant in the metal precursor, and to create a more uniform distribution of dopant in the metal precursor.

Referring to FIG. 10, during multiple depositions, dopings and oxidations in an ALD process, the order of depositions may be altered to achieve the desired electronic properties in the resulting resistive switching element. In this embodiment, a first electrode comprising a suitable material such as poly-Si, P+poly, TiN or W may be deposited onto a substrate. A first metal precursor may then be deposited 1002 onto the first electrode by ALD, CVD, PVD or some equivalent process. For the ALD process a metal precursor may be used to form a dielectric suitable for use as an insulator in a resistive switching element such as $HfO_X$, $ZrO_X$ or $TiO_X$. Any excess metal precursor may then be purged 1003 from the processing chamber by an inert gas such as Ar. A first dopant may then be deposited 1004 onto the first metal precursor by ALD, CVD or PVD. The dopant may be configured to increase oxygen vacancies in resulting metal oxide. The dopant, for the case of the Hf, Zr, and Ti precursors, may be a material such as $Cu^{2+}$, $Sr^{2+}$, $Al^{3+}$, $Y^{3+}$, $La^{3+}$, $Zr^{4+}$ or $Ti^{4+}$. Aliovalent dopants such as $Cu^{2+}$, $Sr^{2+}$, $Al^{3+}$, $Y^{3+}$, $La^{3+}$ are preferred for the tetravalent precursors because these will create vacancies in a compound such as hafnium oxide when these dopants replace a tetravalent atom such as $Hf^{4+}$. Any unabsorbed dopant may then be purged 1005 from the processing chamber by an inert gas such as Ar. The first metal precursor and first dopant may then be oxidized 1006 with a reagent. Any unreacted reagent may then be purged 1007 from the processing chamber by an inert gas such as Ar. Then a second dopant for a second metal precursor may be deposited 1008 by ALD, CVD, PVD or some equivalent process. By depositing the second dopant before depositing a second metal precursor, total dopant concentration and position in the resulting resistive switching element can be adjusted. Deposition pressure or concentration or both may be varied relative to the deposition of the first dopant to achieve a resulting metal oxide with desirable electronic properties such as low forming voltage. Any excess dopant may then be purged 1009 from the processing chamber by an inert gas such as Ar. A second metal precursor may then be deposited 1010 by ALD, CVD or PVD. Deposition pressure or concentration or both may be varied relative to the deposition of the first metal precursor to achieve a resulting metal oxide with desirable electronic properties such as low forming voltage. Any excess metal precursor may then be purged 1011 from the processing chamber by an inert gas such as Ar. The second metal precursor and dopant may then be oxidized 1012 by a reagent. Any unreacted reagent may then be purged 1013 from the processing chamber by an inert gas such as Ar. By this method, the concentration and position of dopant in a resistive switching element may be precisely controlled and made uniform. Uniform doping of the dielectric may enhance the ability of the dielectric to form multiple conductive pathways, and thereby lower the forming and set voltages of the resistive switching element. Processes other then ALD are not shown in FIG. 10 but may be used to implement the present invention.

It should be noted that the present specification specifically uses an example of an insulator in a resistive switching element using such compounds and precursors as $HfO_X$, $ZrO_X$ or $TiO_X$. Further, it should be noted that dopants for such precursors may be materials such as $Cu^{2+}$, $Sr^{2+}$, $Al^{3+}$, $Y^{3+}$, $La^{3+}$, based upon the ability of the dopants to create vacancies in the noted precursors. It should be noted that the portions of the resistive switching element described may be constructed using other compounds aside from binary metallic oxides with the metal having tetravalent characteristics. Further, the dopants for these other precursors should exhibit a similar relationship that the listed dopants exhibit to the listed metal precursors.

It is believed that the present invention and many of its attendant advantages will be understood by the forgoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following Claims to encompass and include such changes.

The invention claimed is:

1. A method for forming resistive switching elements in an atomic layer deposition (ALD) process, the method comprising:
depositing a first metal precursor;
purging any excess quantity of the first metal precursor;
prior to oxidizing the first metal precursor, depositing a first dopant precursor;
purging any excess quantity of the first dopant;
oxidizing the first metal precursor and the first dopant precursor with a reagent,
wherein oxidizing the first metal precursor and the first dopant precursor forms a doped metal oxide,
the doped metal oxide being operable as a resistive switching element of a resistive random access memory (RRAM) cell; and
purging any excess quantity of the reagent,
wherein depositing the first metal precursor, purging any excess quantity of the first metal precursor and depositing the first dopant precursor are performed sequentially.

2. The method of claim 1, further comprising:
depositing a second metal precursor;
purging any excess quantity of the second metal precursor;
depositing a second dopant;
purging any excess quantity of the second dopant;
oxidizing the second metal precursor and the second dopant with a reagent; and
purging any excess quantity of the reagent,
wherein depositing the second metal precursor, purging any excess quantity of the second metal precursor and depositing the second dopant are performed sequentially.

3. The method of claim 2, further comprising varying a concentration of the second metal precursor relative to a concentration of the first metal precursor.

4. The method of claim 2, further comprising varying a duration of the second metal precursor deposition relative to a duration of the first metal precursor deposition.

5. The method of claim 2, further comprising varying a concentration of the second dopant relative to a concentration of the first dopant.

6. The method of claim 2, further comprising varying a duration of the second dopant deposition relative to a duration of the first dopant deposition.

7. The method of claim 2, wherein the first metal precursor is different from the second metal precursor.

8. The method of claim 2, wherein the depositing of the second metal precursor, the purging of any excess quantity of the second metal precursor, and the depositing of the second dopant is performed at a different chamber pressure than the depositing of the first metal precursor, the purging of any excess quantity of the first metal precursor and the depositing the first dopant precursor.

9. The method of claim 1, further comprising:
depositing a second dopant;
purging any excess quantity of the second dopant;
depositing a second metal precursor;
purging any excess quantity of the second metal precursor;
oxidizing the second metal precursor and the second dopant with a reagent; and
purging any excess quantity of the reagent,
wherein depositing the second dopant, purging any excess quantity of the second dopant and depositing the second metal precursor are performed sequentially.

10. The method of claim 9, further comprising varying a concentration of the second metal precursor relative to a concentration of the first metal precursor.

11. The method of claim 9, further comprising varying a duration of the second metal precursor deposition relative to a duration of the first metal precursor deposition.

12. The method of claim 9, further comprising varying a concentration of the second dopant relative to a concentration of the first dopant.

13. The method of claim 9, further comprising varying a duration of the second dopant deposition relative to a duration of the first dopant deposition.

14. The method of claim 1, further comprising:
depositing a second metal precursor;
purging any excess quantity of the second metal precursor;
oxidizing the second metal precursor with a reagent; and
purging any excess quantity of the reagent.

15. The method of claim 1, wherein the first metal precursor comprises one of hafnium, zirconium, or titanium.

16. The method of claim 15, wherein the first dopant precursor comprises one of copper, strontium, aluminum, yttrium, or lanthanum.

17. The method of claim 1, wherein the doped metal oxide comprises oxygen vacancies.

18. The method of claim 1, wherein the doped metal oxide comprises hafnium oxide doped with one of aluminum or titanium.

19. The method of claim 1, wherein the depositing of the first metal precursor, the purging of any excess quantity of the first metal precursor, and the depositing of the first dopant precursor is repeated at least once.

* * * * *